United States Patent
Suzuki et al.

(10) Patent No.: US 8,432,958 B2
(45) Date of Patent: Apr. 30, 2013

(54) APPARATUS FOR MEASURING JITTER TRANSFER CHARACTERISTIC

(75) Inventors: Seiya Suzuki, Atsugi (JP); Takashi Aoki, Atsugi (JP); Ken Mochizuki, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 380 days.

(21) Appl. No.: 12/691,376

(22) Filed: Jan. 21, 2010

(65) Prior Publication Data
US 2010/0316105 A1  Dec. 16, 2010

(30) Foreign Application Priority Data
Jan. 22, 2009 (JP) ................. 2009-011633

(51) Int. Cl.
*H04B 3/46* (2006.01)
(52) U.S. Cl.
USPC .............. 375/226; 331/16; 714/700
(58) Field of Classification Search .......... 331/16; 332/144; 375/226, 371; 714/700
See application file for complete search history.

(56) References Cited

U.S. PATENT DOCUMENTS

| | | | |
|---|---|---|---|
| 7,593,317 B2* | 9/2009 | Yuda et al. ............ | 370/208 |
| 2003/0231075 A1* | 12/2003 | Heiskala et al. ......... | 332/103 |
| 2005/0231292 A1* | 10/2005 | Akahori et al. .......... | 331/16 |
| 2008/0139150 A1* | 6/2008 | Li et al. ............... | 455/230 |
| 2008/0310529 A1* | 12/2008 | Futatsugi .............. | 375/260 |

FOREIGN PATENT DOCUMENTS
JP  A 8-220163  8/1996
\* cited by examiner

*Primary Examiner* — Leon-Viet Nguyen
(74) *Attorney, Agent, or Firm* — Greer, Burns & Crain, Ltd.

(57) ABSTRACT

An apparatus for rapidly measuring jitter transfer characteristics is provided. A modulation signal generator generates a modulation signal M including a plurality of sinusoidal components having known amplitudes $m_1$ to $m_n$ and different frequencies $f_1$ to $f_n$, and outputs the modulation signal M to a jitter generator. A clock signal C phase-modulated by the modulation signal M is input to a data signal generator, a data signal D synchronized with the clock signal C is provided to a measurement object, a data signal D' output from the measurement object is input to a clock recovery unit to recover a clock signal component C', and the clock signal component C' is phase-detected by a phase detector. A signal amplitude detector detects the amplitudes of the plurality of sinusoidal components included in the modulation signal M from an output signal M' of the phase detector, and an operation processor calculates a ratio of the detected amplitudes and the known amplitudes for each of the sinusoidal components, respectively.

7 Claims, 5 Drawing Sheets

$Mi(t) = \sin[\sum_{i=1}^{n} m_i \cdot \sin(p_i t)]$ $Mq(t) = \cos[\sum_{i=1}^{n} m_i \cdot \sin(p_i t)]$ $C = \sin[\omega t + \sum_{i=1}^{n} m_i \cdot \sin(p_i t)]$ $M(t) = \sum_{i=1}^{n} m_i \cdot \sin(p_i t)$ $C = \sin[\omega t + \sum_{i=1}^{n} m_i \cdot \sin(p_i t)]$

APPARATUS FOR MEASURING JITTER TRANSFER CHARACTERISTIC

FIELD OF THE INVENTION

The present invention relates to a technique for rapidly measuring a jitter transfer characteristic of various devices, which perform a reading process on an input data signal such as a data relay and the like.

BACKGROUND

In order to prevent deterioration of a waveform of a data signal, a device such as a data relay and the like extracts a clock signal component from an input data signal, reads the data signal at a level transition timing of the clock signal, and outputs the read data signal.

As the performance required for this kind of device, the degree of improvement in jitter (i.e., phase fluctuation) of the input data signal, that is, the ability to suppress the transfer of jitter is defined as a jitter transfer characteristic.

Conventionally, an apparatus 10 for measuring a jitter transfer characteristic having the configuration shown in FIG. 7 has been used to measure the jitter transfer characteristic.

The apparatus 10 for measuring the jitter transfer characteristic includes a jitter generator 11 which outputs a clock signal C phase-modulated by an input modulation signal M, a modulation signal generator 12 which generates a sinusoidal modulation signal M having a known amplitude m and a frequency f and outputs the sinusoidal modulation signal M to the jitter generator 11, and a data signal generator 13 which generates a data signal D (e.g., a pseudo-random signal) synchronized with the clock signal C output from the jitter generator 11 and provides the data signal D to a measurement object 1 such as a relay and the like. Meanwhile, the modulation signal generator 12 is configured to change the frequency f of the modulation signal M according to an instruction of an operation processor 18, which will be described later.

The measurement object 1 receiving the data signal D performs a reading process on the data signal D and outputs the read data signal D'.

A clock recovery unit 15 receives the read data signal D' from the measurement object 1, recovers a clock signal component C' from the data signal D', and outputs the clock signal component C' to a phase detector 16.

The phase detector 16 detects the phase of the clock signal component C' and provides a signal M' obtained by the phase detection to an amplitude detector 17. The amplitude detector 17 calculates an amplitude m' by detecting the signal M' and provides the amplitude m' to the operation processor 18.

The operation processor 18 calculates the ratio m'/m of the amplitude m' obtained by the amplitude detector 17 and the known amplitude m of the modulation signal M and calculates the amount of jitter transfer Tj(f) of the measurement object 1 at the jitter frequency f as a logarithm of the ratio. Upon completion of the calculation, the operation processor 18 converts the frequency f of the modulation signal M into another frequency and repeats the process for calculating the amount of jitter transfer Tj(f), thus obtaining a jitter transfer characteristic F indicating how the amount of jitter transfer is changed within a desired frequency range as shown in FIG. 6.

It is possible to determine the amount of jitter transfer (the amount of suppression) of the measurement object 1 at each jitter frequency from the thus obtained jitter transfer characteristic F.

Meanwhile, the apparatus for measuring the jitter transfer characteristic with the above-described configuration is disclosed, for example, in Japanese Patent Publication No. 1996-220163.

However, the above-described conventional apparatus for measuring the jitter transfer characteristic requires an averaging process in consideration of the influence of noise when calculating an amplitude V' of the detected modulation signal M. Therefore, the conventional apparatus requires a long time to obtain the amplitudes V' as many as the number of points of the required jitter frequencies when the measurement is made at each jitter frequency point in the above-described manner, which is inefficient.

SUMMARY

The present invention has been made in an effort to solve the above-described problems associated with the prior art, and an object of the present invention is to provide an apparatus for measuring a jitter transfer characteristic which can rapidly measure a jitter transfer characteristic.

According to an aspect of the present invention, there is provided an apparatus for measuring a jitter transfer characteristic, the apparatus comprising: a modulation signal generator which generates a modulation signal including a plurality of sinusoidal wave components having known amplitudes and different frequencies; a jitter generator which receives the modulation signal from the modulation signal generator and outputs a clock signal phase-modulated by the modulation signal; a data signal generator which generates an input data signal synchronized with the clock signal and provides the input data signal to a device under test; a clock recovery unit which receives a result data signal output from the device under test receiving the input data signal and recovers a clock signal component included in the result data signal; a phase detector which receives the clock signal component from the clock recovery unit and detects the phase of the clock signal component and outputs a signal indicating phase change; a signal amplitude detector which detects each of the amplitudes of the plurality of sinusoidal wave components included in the signal indicating the phase change; and an operation processor which calculates a ratio of each of the amplitudes of the sinusoidal wave components detected by the signal amplitude detector and each of the known amplitudes of the sinusoidal wave components, respectively.

The signal amplitude detector may comprise: a plurality of filters each extracting each of the plurality of sinusoidal wave components included in the signal indicating the phase change; and a plurality of detectors each detecting each of the plurality of sinusoidal wave components extracted by each of the plurality of filters and calculating each of the amplitudes of the plurality of sinusoidal wave components.

The signal amplitude detector may comprise: an analog-to-digital converter converting the signal indicating the phase change into a digital signal; and a fast Fourier transformer performing fast Fourier transformation on the digital signal and detecting each of the amplitudes of the plurality of sinusoidal wave components included in the signal indicating the phase change.

The jitter generator may comprise a quadrature modulator.

The quadrature modulator may input a carrier signal Ca of frequency fc output from a carrier signal generator and a carrier signal generated by phase shifting the carrier signal by 90 degree by a phase shifter to multiplying mixers respectively, wherein an in-phase and a quadrature component included in quadrature modulation signals output from the modulation signal generator are input to the mixers respectively, and wherein outputs of the mixers are added by an adder.

The jitter generator may comprise a phase locked loop (PLL).

The phase locked loop (PLL) converts an output of a voltage control oscillator (VCO), which oscillates around the carrier frequency, into a low frequency signal by a frequency divider, inputs the converted signal together with a reference signal R having the same frequency as the value obtained by dividing the carrier frequency by a frequency dividing ratio of the frequency divider to a phase comparator, extracts a control signal for synchronizing the output of the frequency divider with the reference signal R by a filter receiving an outputs of the phase comparator extracted from an output of the phase comparator by the filter, and provides the control signal to the VCO through an adder.

According to the other aspect of the present invention, there is provided a method for measuring a jitter transfer characteristic, the method comprising the steps of: generating a modulation signal including a plurality of sinusoidal wave components having known amplitudes and different frequencies; receiving the modulation signal from the modulation signal generator and outputting a clock signal phase-modulated by the modulation signal; generating an input data signal synchronized with the clock signal and providing the data signal to a device under test; receiving a result data signal output from the device under test receiving the input data signal and recovering a clock signal component included in the result data signal; receiving the clock signal component and detecting the phase of the clock signal component and outputs a signal indicating phase change; detecting each of the amplitudes of the plurality of sinusoidal wave components included in the signal indicating phase change; and calculating a ratio of each of the amplitudes of the detected sinusoidal wave components and each of the known amplitudes of the sinusoidal wave components, respectively.

According to the apparatus for measuring the jitter transfer characteristic of the present invention, the modulation signal generator is configured to generate a modulation signal including a plurality of sinusoidal components having known amplitudes and different frequencies and output the modulation signal to the jitter generator, the signal amplitude detector is configured to detect the amplitudes of the plurality of sinusoidal components included in the modulation signal from the output signal of the phase detector, and the operation processor is configured to calculate the ratio of each of the detected amplitudes and each of the known amplitudes of the sinusoidal components, respectively. Therefore, it possible to obtain the amount of jitter transfer for a plurality of jitter frequencies at a time, and thus it is possible to very effectively measure the jitter transfer characteristic.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION

Hereinafter, exemplary embodiments of the present invention will be described in detail below with reference to the accompanying drawings such that those skilled in the art to which the present invention pertains can easily practice the present invention.

Figure 1:
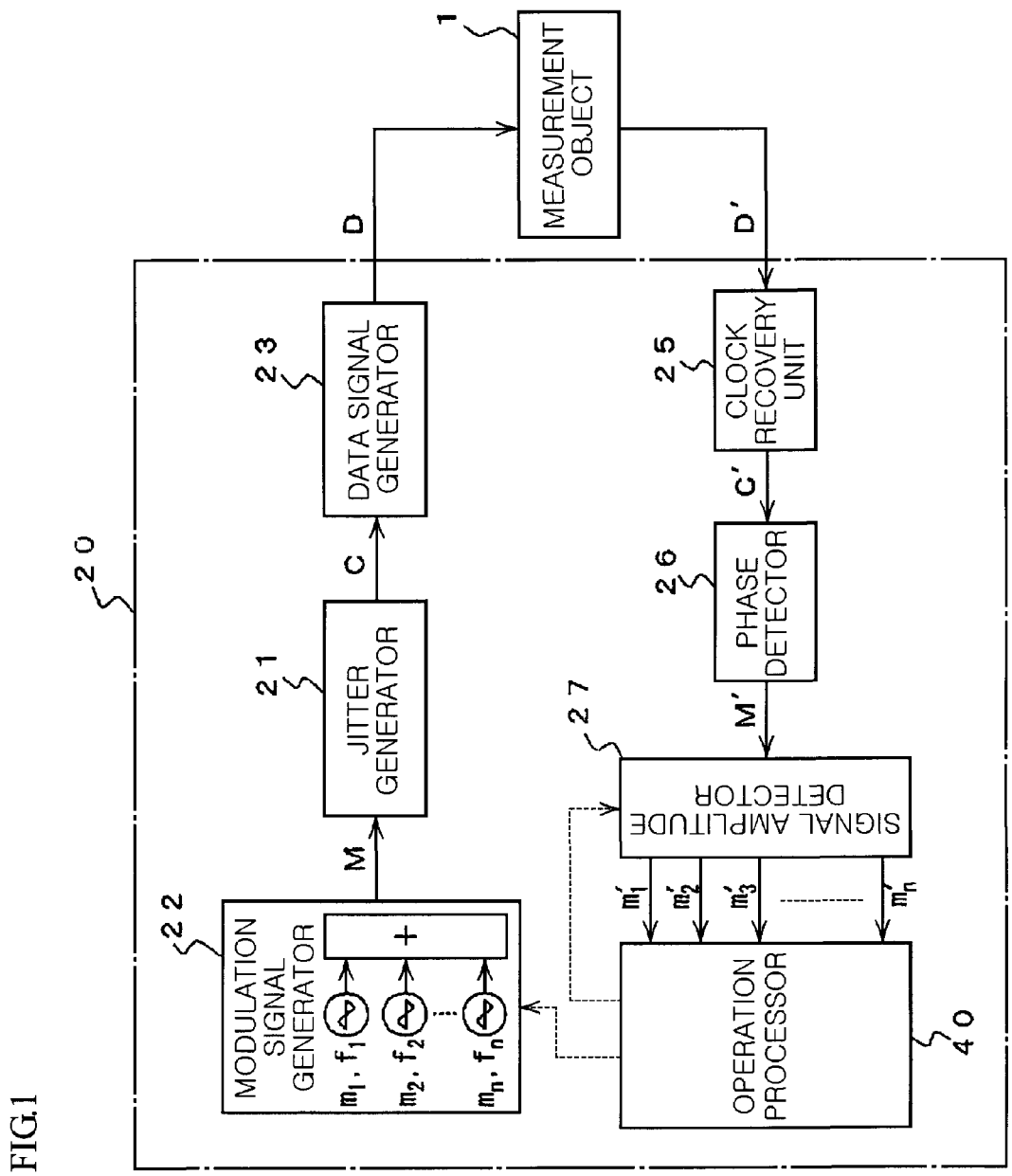
FIG. 1 is a diagram showing a configuration of an apparatus for measuring a jitter transfer characteristic in accordance with an exemplary embodiment of the present invention.

FIG. 1 shows a configuration of an apparatus 20 for measuring a jitter transfer characteristic according to the present invention.

The apparatus 20 for measuring the jitter transfer characteristic includes a jitter generator 21 which receives a modulation signal M output from a modulation signal generator 22 and outputs a clock signal C phase-modulated by the modulation signal M.

Figure 2:
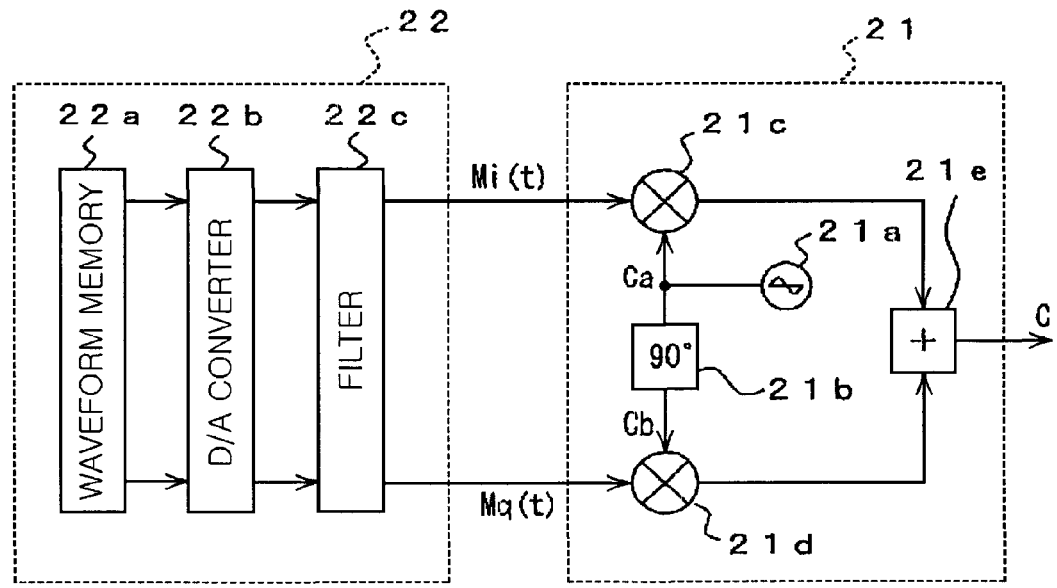
FIG. 2 is a diagram showing a configuration related to jitter generation in accordance with an exemplary embodiment of the present invention.
Figure 3:
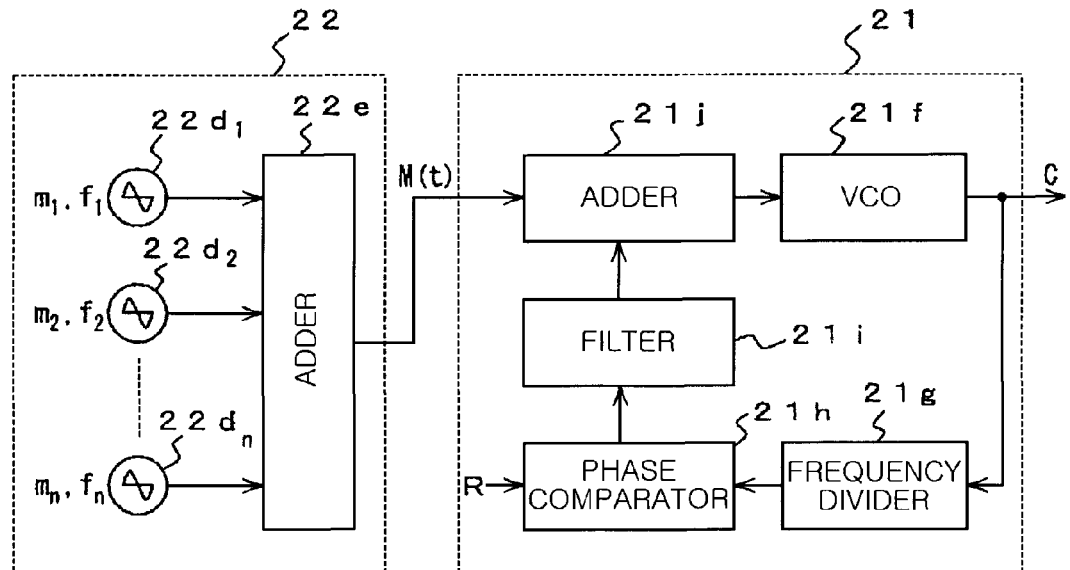
FIG. 3 is a diagram showing another configuration related to jitter generation in accordance with an exemplary embodiment of the present invention.

The jitter generator 21 may have a variety of configurations such as a quadrature modulator configuration shown in FIG. 2 or a phase locked loop (PLL) configuration shown in FIG. 3, for example.

In the case of the quadrature modulator configuration shown in FIG. 2, a carrier signal Ca of frequency fc output from a carrier signal generator 21a and a carrier signal Cb generated by phase shifting the carrier signal Ca by 90 degree by a phase shifter 21b are input to multiplying mixers 21c and 21d, respectively.

Meanwhile, quadrature modulation signals Mi(t) and Mq(t) output from the modulation signal generator 22 are input to the mixers 21c and 21d, respectively, and outputs of the mixers 21c and 21d are added by an adder 21e.

Here, the quadrature modulation signals Mi(t) and Mq(t) are represented by the following equations.

$$Mi(t) = \sin[m_1 \cdot \sin(p_1 t) + m_2 \cdot \sin(p_2 t) \ldots + m_n \cdot \sin(p_n t)]$$
$$= \sin\left[\sum m_i \cdot \sin(p_i t)\right]$$
$$Mq(t) = \cos[m_1 \cdot \sin(p_1 t) + m_2 \cdot \sin(p_2 t) \ldots + m_n \cdot \sin(p_n t)]$$
$$= \cos\left[\sum m_i \cdot \sin(p_i t)\right]$$

Herein, $P_1$ to $P_n$ represent the desired different angular frequencies of phase modulation, $m_1$ to $m_n$ represent the desired depths of the phase modulation, and symbol $\Sigma$ represents the sum of i=1 to n.

In the case of using the quadrature modulation signals Mi(t) and Mq(t), an output C of the adder 21e is represented by the following equation (1) where ω represents the angular frequency.

$$C = Mi(t) \cdot \cos(\omega t) + Mq(t) \cdot \sin(\omega t)$$
$$= \cos(\omega t) \cdot \sin\left[\sum m_i \cdot \sin(p_i t)\right] + \sin(\omega t) \cdot \cos\left[\sum m_i \cdot \sin(p_i t)\right]$$
$$= \sin\left[(\omega t) + \sum m_i \cdot \sin(p_i t)\right]$$

The above equation represents the result of modulating the phase of the carrier signal with the angular frequency ω by a plurality (n) of sinusoidal waves having amplitudes $m_1$ to $m_n$ and angular frequencies $p_1$ to $p_n$.

That is, it can be said that the quadrature modulation signals Mi(t) and Mq(t) form the modulation signal including the sinusoidal waves having the amplitudes $m_1$ to $m_n$ and the frequencies $p_1/2\pi$ to $p_n/2\pi$ with respect to the jitter generator 21 of the quadrature modulator configuration.

For example, as shown in FIG. 2, the quadrature modulation signals Mi(t) and Mq(t) are stored with respect to each group of n number of frequencies in a waveform memory 22a of the modulation signal generator 22. These signals are read from the waveform memory 22a by an operation processor 40, which will be described later, and converted into analog signals by a D/A converter 22b. Then, the analog signals, from which the quantization noise is removed by a filter 22c, are output to the jitter generator 21 of the quadrature modulator configuration.

Moreover, in the case of a jitter generator 21 of the PLL configuration shown in FIG. 3, an output of a voltage control oscillator (VCO) 21f, which oscillates around the carrier frequency, is converted into a low frequency signal by a frequency divider 21g (or a heterodyne frequency converter), and the converted signal together with a reference signal R having the same frequency as the value obtained by dividing the carrier frequency by a frequency dividing ratio of the frequency divider 21g are input to a phase comparator 21h. Then, a control signal for synchronizing the output of the frequency divider 21g with the reference signal R is extracted from an output of the phase comparator 21h by a filter 21i and provided to the VCO 21f through an adder 21j. The output frequency of the VCO 21f is locked to the carrier frequency by a control loop of the PLL. However, since the modulation signal M from the modulation signal generator 22 is input to the adder 21j, the phase of the output signal C of the VCO 21f varies according to the amplitude of the modulation signal M.

As shown in FIG. 3, for example, the modulation signal M from the modulation signal generator 22 is generated by a plurality of sinusoidal wave generators $22d_1$ to $22d_n$, which output a plurality (n) of sinusoidal waves having known amplitudes $m_1$ to $m_n$ and different frequencies, and an adder 22e, which adds the outputs of the sinusoidal wave generators $22d_1$ to $22d_n$. In this case, the frequencies of the sinusoidal waves output by the n number of sinusoidal wave generators $22d_1$ to $22d_n$ may be varied by the operation processor 40 so as to select another group of n number of frequencies.

Furthermore, a circuit for extracting the required frequency components by a filter from a signal with a harmonic as a non-sinusoidal wave may be also used, and thus the modulation signal M used in the case of directly applying a phase modulation to the oscillator of the carrier in the above-described manner is not limited to the configuration shown in FIG. 3.

As a result, the clock signal C output from the jitter generator 21 includes a jitter component phase-modulated by the plurality (n) of sinusoidal waves having the known amplitudes and different frequencies. This clock signal C is input to a data signal generator 23.

The data signal generator 23, which may comprise a pseudo-random signal generator, for example, generates a pseudo-random signal synchronized with the clock signal C and provides the pseudo-random signal as a serial data signal D to a measurement object 1. Since the data signal D is synchronized with the clock signal C, it is given the same jitter as the clock signal S.

In the case where the measurement object 1 is a relay, it performs a reading process on the data signals D and outputs the read data signals D'.

The clock recovery unit 25 recovers a clock signal component C' from the serial data signal D' output from the measurement object 1.

This clock recovery is performed, for example, by supplementing an omitted portion of the clock in a manner to perform exclusive OR of a data signal having a non-return to zero (NRZ) format and the data signal delayed by a half-bit therefrom and to pass it through a band-pass filter (BPF). Meanwhile, the jitter of the data signal D' passing through the BFP is included as it is in the clock signal component C' obtained by this clock recovery.

The recovered clock signal component C' is input to the phase detector 26 and a signal M' indicating the phase change is output.

Here, the phase detector 26 may detect the phase change using any one of an analog circuit, an arithmetic circuit, and a logic circuit for a digital signal process. In the case of the analog circuit, the output signal M' of the phase detector 26 is a voltage signal, and in the case of the arithmetic circuit or the logic circuit, it is a numerical series indicating the phase change sampled at regular intervals.

The output signal M' of the phase detector 26 is input to a signal amplitude detector 27.

The signal amplitude detector 27 detects each of the amplitudes $m_1'$ to $m_n'$ of the plurality (n) of sinusoidal components included in the modulation signal M from the output signal M' of the phase detector 26.

Figure 4:
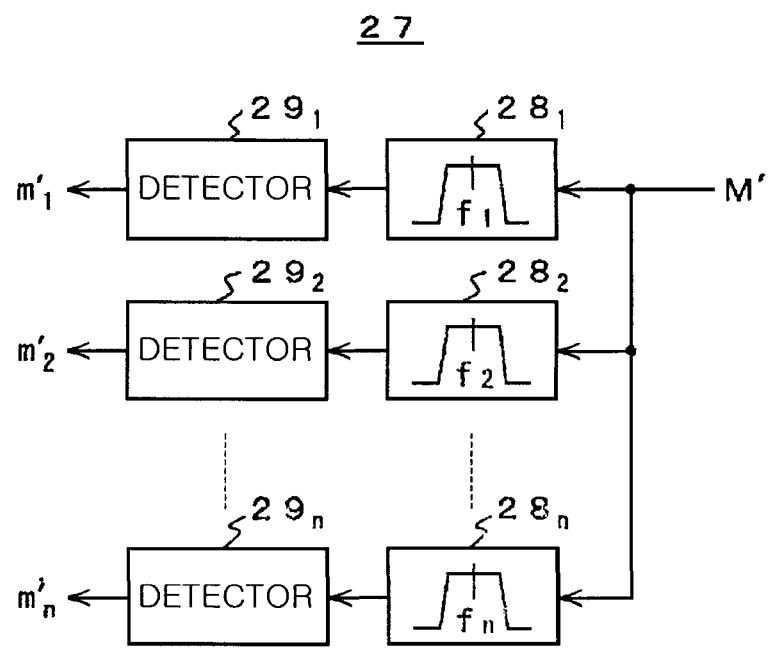
FIG. 4 is a diagram showing a configuration of an amplitude detector in accordance with an exemplary embodiment of the present invention.

Here, as shown in FIG. 4, the signal amplitude detector 27 may include a plurality of filters $28_1$ to $28_n$ each extracting each of the plurality (n) of sinusoidal components included in the modulation signal M from the output signal M' of the phase detector 26 and a plurality of detectors $29_1$ to $29_n$ each detecting each of the plurality (n) of sinusoidal components extracted by the plurality of filters $28_1$ to $28_n$ and calculating the amplitudes $m_1'$ to $m_n'$ thereof.

Meanwhile, in the case where the output signal M' is a voltage signal, these filtering and detecting processes may be performed by analog-to-digital converting in front of the signal amplitude detector 27 and then digital processing, and in the case where the output signal M' is a numerical series, they may be performed directly by digital processing. Meanwhile, a passing center frequency of each of the filters $28_1$ to $28_n$ may be fixed or varied. When the passing center frequency is varied, it is changed to a value specified by frequency information from an operation processor 40, which will be described later.

Figure 5:
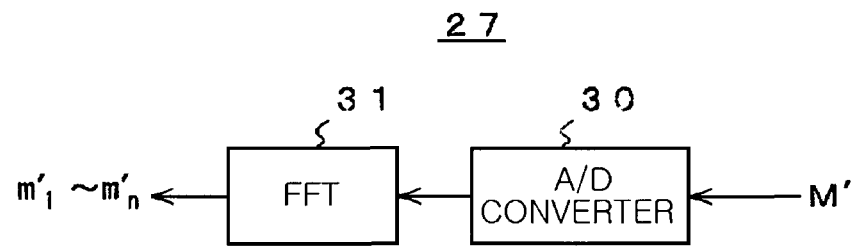
FIG. 5 is a diagram showing another configuration of an amplitude detector in accordance with an exemplary embodiment of the present invention.

Moreover, as shown in FIG. 5, in the case where the output signal M' of the phase detector 26 is a voltage signal, the signal amplitude detector 27 may convert the output signal M' of the phase detector 26 to a digital signal by an A/D converter 30, input the digital signal to a fast Fourier transformer (FFT) 31, and detect the amplitude of each frequency of the plurality (n) of sinusoidal components included in the modulation signal M by the Fourier transformation of the FFT 31. In addition, in the case where the output signal M' of the phase detector 26 is a numerical series, it is possible to eliminate the A/D converter 30 and directly perform the Fourier transformation.

The amplitudes $m_1'$ to $m_n'$ of the sinusoidal components obtained in the above-described manner are input to the operation processor 40.

The operation processor 40 calculates the ratio of each of the amplitudes $m_1'$ to $m_n'$ of the sinusoidal components detected by the signal amplitude detector 27 and each of the known amplitudes $m_1$ to $m_n$ of the sinusoidal components, respectively and calculates the amount of jitter transfer Tj at each frequency $f_i = P_i/2\pi$ of the sinusoidal component by the following equation.

$$Ti(fi) = 20 \log(mi'/mi)$$

Figure 6:
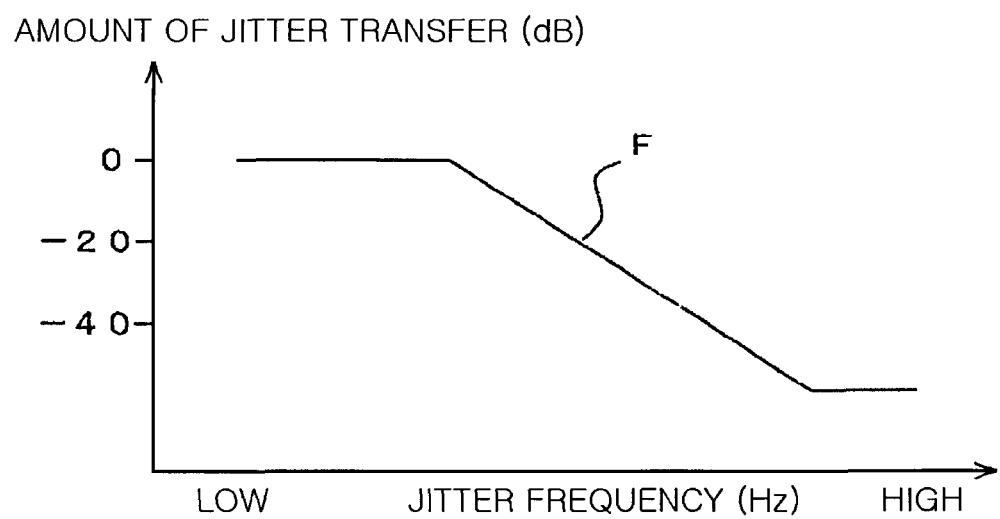
FIG. 6 is a diagram showing an example of a jitter transfer characteristic.
Figure 7:
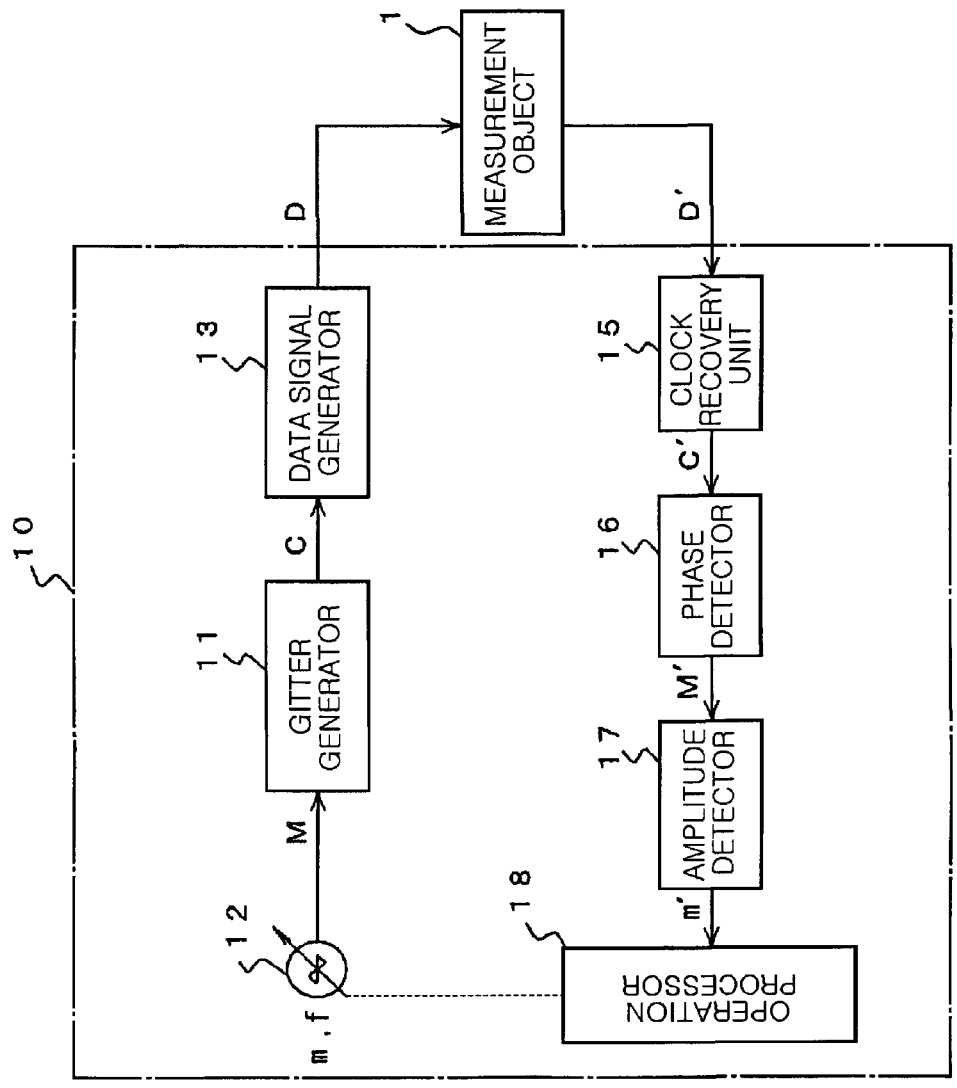
FIG. 7 is a diagram showing configuration of a conventional apparatus for measuring a jitter transfer characteristic.

Here, if the number k of frequency points calculated in the jitter transfer characteristic is equal to n, the amount of jitter transfer $Tj(f_1)$ to $Tj(f_{1k})$ of all required frequency points are obtained by calculating the n amplitudes $m_1'$ to $m_n'$. For example, when plotting the jitter frequencies on the horizontal axis on a screen of a display device (not shown) and the amount of jitter transfer on the vertical axis, a jitter transfer characteristic F as shown in FIG. 6 is obtained.

Also, in the case where the number k of the frequency points calculated in the jitter transfer characteristic is greater than n and is a multiple of n (k=u·n), it is possible to obtain the amounts of jitter transfer $Tj(f_1)$ to $Tj(f_k)$ for all frequencies by repeating u−1 times a process for converting the signal output from the modulation signal generator 22 into a signal corresponding to another n number of sinusoidal components having different frequencies, providing frequency information of each of the sinusoidal components to the signal amplitude detector 27 to detect their amplitudes $m_{n+1}'$ to $m_{2n}'$, and obtaining the amounts of jitter transfer $Tj(f_{n+1})$ to $Tj(f_{2n})$ in the above-described manner.

Meanwhile, although any combination of the n sinusoidal components is possible, if the frequencies are too far apart or too close, it may reduce the frequency resolution of the filters or fast Fourier transformer. Therefore, it is preferable to determine the interval of the n sinusoidal components so as to be separated by a few filter taps in a close frequency range.

According to the apparatus 20 for measuring the jitter transfer characteristic according to an exemplary embodiment of the present invention, the modulation signal generator 22 is configured to generate the modulation signal including the plurality of sinusoidal components having the known amplitudes and different frequencies and output the modulation signal to the jitter generator 21, the signal amplitude detector 27 is configured to detect the amplitudes of the plurality of sinusoidal components included in the modulation signal from the output signal of the phase detector 26, and the operation processor 40 is configured to calculate the ratio of each of the detected amplitudes and each of the known amplitudes of the sinusoidal components, respectively, Therefore, it possible to obtain the amounts of jitter transfer for a plurality of jitter frequencies at a time, and thus it is possible to very effectively measure the jitter transfer characteristic.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

The invention claimed is:

1. An apparatus for measuring a jitter transfer characteristic, the apparatus comprising:
    a modulation signal generator which generates a modulation signal including a plurality of sinusoidal wave components having known amplitudes and different frequencies;
    a jitter generator which receives the modulation signal from the modulation signal generator and outputs a clock signal phase-modulated by the modulation signal;
    a data signal generator which generates an input data signal synchronized with the clock signal and provides the input data signal to a device under test;
    a clock recovery unit which receives a result data signal output from the device under test receiving the input data signal and recovers a clock signal component included in the result data signal;
    a phase detector which receives the clock signal component from the clock recovery unit and detects the phase of the clock signal component and outputs a signal indicating phase change;
    a signal amplitude detector which detects each of the amplitudes of the plurality of sinusoidal wave components included in the signal indicating the phase change; and
    an operation processor which calculates a ratio of each of the amplitudes of the sinusoidal wave components detected by the signal amplitude detector and each of the known amplitudes of the sinusoidal wave components, respectively,
    wherein the signal amplitude detector comprises:
    a plurality of filters each extracting each of the plurality of sinusoidal wave components included in the signal indicating the phase change; and
    a plurality of detectors each detecting each of the plurality of sinusoidal wave components extracted by each of the plurality of filters and calculating each of the amplitudes of the plurality of sinusoidal wave components.

2. The apparatus of claim 1 wherein the signal amplitude detector comprises:
    an analog-to-digital converter converting the signal indicating the phase change into a digital signal; and
    a fast Fourier transformer performing fast Fourier transformation on the digital signal and detecting each of the amplitudes of the plurality of sinusoidal wave components included in the signal indicating the phase change.

3. The apparatus of claims 1 or 2, wherein the jitter generator comprises a quadrature modulator.

4. The apparatus of claim 3, wherein the quadrature modulator inputs a carrier signal Ca of frequency fc output from a carrier signal generator and a carrier signal Cb generated by phase shifting the carrier signal Ca by 90 degree by a phase shifter to multiplying mixers,
    wherein an in-phase and a quadrature component included in quadrature modulation signals output from the modulation signal generator are input to the mixers, and
    wherein outputs of the mixers are added by an adder.

5. The apparatus of claims 1 or 2, wherein the jitter generator comprises a phase locked loop (PLL).

6. The apparatus of claim 5, wherein the phase locked loop (PLL) converts an output of a voltage control oscillator (VCO), which oscillates around the carrier frequency, into a low frequency signal by a frequency divider, inputs the converted signal together with a reference signal R having the same frequency as the value obtained by dividing the carrier frequency by a frequency dividing ratio of the frequency divider to a phase comparator, extracts a control signal for synchronizing the output of the frequency divider with the reference signal R by a filter receiving an outputs of the phase comparator extracted from an output of the phase comparator by the filter, and provides the control signal to the VCO through an adder.

7. An apparatus for measuring a jitter transfer characteristic, the apparatus comprising:
a modulation signal generator which generates a modulation signal including a plurality of sinusoidal wave components having known amplitudes and different frequencies;
a jitter generator which receives the modulation signal from the modulation signal generator and outputs a clock signal phase-modulated by the modulation signal;
a data signal generator which generates an input data signal synchronized with the clock signal and provides the input data signal to a device under test;
a clock recovery unit which receives a result data signal output from the device under test receiving the input data signal and recovers a clock signal component included in the result data signal;
a phase detector which receives the clock signal component from the clock recovery unit and detects the phase of the clock signal component and outputs a signal indicating phase change;
a signal amplitude detector which detects each of the amplitudes of the plurality of sinusoidal wave components included in the signal indicating the phase change; and
an operation processor which calculates a ratio of each of the amplitudes of the sinusoidal wave components detected by the signal amplitude detector and each of the known amplitudes of the sinusoidal wave components, respectively;
wherein the operation processor calculates the ratio of each of the amplitudes $m1'$ to $mn'$ of the sinusoidal components detected by the signal amplitude detector and each of the known amplitudes $m1$ to $mn$ of the sinusoidal components, respectively and calculates the amount of jitter transfer Tj at each frequency $fi=Pi/2\pi$ of the sinusoidal component by the following equation:

$$Ti(fi) = 20 \log(mi'/mi);$$

if the number k of frequency points calculated in the jitter transfer characteristic is equal to n, the amount of jitter transfer $Tj(f1)$ to $Tj(fk)$ of all required frequency points are obtained by calculating the n amplitudes $m1'$ to $mn'$, and if the number k of the frequency points calculated in the jitter transfer characteristic is greater than n and is a multiple of n ($k=uXn$), are obtained the amounts of jitter transfer $Tj(f1)$ to $Tj(fk)$ for all frequencies by repeating $u-1$ times a process for converting the signal output from the modulation signal generator into a signal corresponding to another n number of sinusoidal components having different frequencies, providing frequency information of each of the sinusoidal components to the signal amplitude detector to detect their amplitudes $mn+1'$ to $m2n'$, and obtaining the amounts of jitter transfer $Tj(fn+1)$ to $Tj(f2n)$ in the above-described manner.

* * * * *